United States Patent
Theis et al.

(10) Patent No.: US 8,560,912 B2
(45) Date of Patent: Oct. 15, 2013

(54) METHOD AND APPARATUS FOR ERASURE DECODING AN ECC CODED BITSTREAM

(75) Inventors: Oliver Theis, Hannover (DE); Xiaoming Chen, Hannover (DE); Friedrich Timmermann, Garbsen (DE)

(73) Assignee: Thomson Licensing, Boulogne-Billancourt (FR)

(*) Notice: Subject to any disclaimer, the term of this patent is extended or adjusted under 35 U.S.C. 154(b) by 113 days.

(21) Appl. No.: 12/998,542

(22) PCT Filed: Oct. 28, 2009

(86) PCT No.: PCT/EP2009/064207
§ 371 (c)(1),
(2), (4) Date: Apr. 29, 2011

(87) PCT Pub. No.: WO2010/052159
PCT Pub. Date: May 14, 2010

(65) Prior Publication Data
US 2011/0225474 A1    Sep. 15, 2011

(30) Foreign Application Priority Data

Nov. 5, 2008 (EP) .................................. 08305774

(51) Int. Cl.
*H03M 13/00* (2006.01)
*G06F 11/00* (2006.01)

(52) U.S. Cl.
USPC ............................ 714/752; 714/701; 714/704

(58) Field of Classification Search
USPC .......................................... 714/752, 701, 704
See application file for complete search history.

(56) References Cited

U.S. PATENT DOCUMENTS

| | | | |
|---|---|---|---|
| 6,367,049 B1* | 4/2002 | Van Dijk et al. | 714/761 |
| 6,378,100 B1* | 4/2002 | Van Dijk et al. | 714/752 |
| 6,604,217 B1* | 8/2003 | Kahlman | 714/752 |
| 7,281,193 B2* | 10/2007 | Wu et al. | 714/758 |
| 7,284,183 B2* | 10/2007 | Wu et al. | 714/758 |
| 7,489,258 B2* | 2/2009 | Bentvelsen et al. | 341/58 |
| 7,877,661 B2* | 1/2011 | Kahlman | 714/752 |
| 8,069,398 B2* | 11/2011 | Wu et al. | 714/776 |

FOREIGN PATENT DOCUMENTS

| | | |
|---|---|---|
| EP | 1940033 | 7/2008 |
| EP | 1990918 | 11/2008 |

OTHER PUBLICATIONS

Youngki Kim etal A New Error Correction Algorithm for High-Density Optical Storage Systems Japanese Jouornal of Appliled Physics, vol. 43, No. 7B, 2004, pp. 4867-4869.
Search Report Dated Dec. 6, 2010.

\* cited by examiner

*Primary Examiner* — John J Tabone, Jr.
(74) *Attorney, Agent, or Firm* — Robert D. Shedd; Patricia Verlangieri

(57) ABSTRACT

The error correction capability of block codes can be doubled if error locations are known. Prior art approaches for error location detection always involve adding dedicated redundant data which then are evaluated to yield error location information. The present invention proposes and describes how error location information in the form of clues is derived from given DC control bits that are anyway present in a data stream.

4 Claims, 5 Drawing Sheets

Figure 1 --Prior Art--

| | $u_{i-1}^{tail}$ | $c_i^{pre}$ | $c_i^{inv}$ | $u_i^{head}$ | Code |
|---|---|---|---|---|---|
| 1 | | 00 | | | 101 |
| 2 | | | 11 | | 010 |
| | | | | | |
| 3 | | 00 | | 00 | 101.000 |
| 4 | | | 10 | 00 | 001.000 |
| 5 | | 11 | | 01 | 010 100 |
| 6 | | | 10 | 01 | 010.000 |
| | | | | | |
| 7 | 00 | 00 | | | 101.000 |
| 8 | 00 | | 01 | | 100.000 |
| 9 | 10 | 11 | | | 001 010 |
| 10 | 10 | | 00 | | 001.000 |

Table 1

| clue | valid | clue | valid | clue | valid | clue | valid | clue | valid | clue | valid | clue | valid | clue | valid |
|------|-------|------|-------|------|-------|------|-------|------|-------|------|-------|------|-------|------|-------|
| 0 | 1 | 8 | 1 | 16 | 1 | 24 | 1 | 32 | 1 | 40 | 0 | 48 | 1 | 56 | 1 |
| 1 | 1 | 9 | 1 | 17 | 0 | 25 | 1 | 33 | 1 | 41 | 0 | 49 | 0 | 57 | 1 |
| 2 | 1 | 10 | 0 | 18 | 1 | 26 | 0 | 34 | 1 | 42 | 0 | 50 | 1 | 58 | 0 |
| 3 | 1 | 11 | 0 | 19 | 1 | 27 | 0 | 35 | 1 | 43 | 0 | 51 | 1 | 59 | 0 |
| 4 | 1 | 12 | 0 | 20 | 0 | 28 | 0 | 36 | 0 | 44 | 1 | 52 | 0 | 60 | 0 |
| 5 | 1 | 13 | 1 | 21 | 0 | 29 | 1 | 37 | 0 | 45 | 1 | 53 | 0 | 61 | 1 |
| 6 | 1 | 14 | 1 | 22 | 0 | 30 | 1 | 38 | 0 | 46 | 1 | 54 | 0 | 62 | 1 |
| 7 | 1 | 15 | 1 | 23 | 0 | 31 | 1 | 39 | 0 | 47 | 1 | 55 | 0 | 63 | 1 |

Table 2

| clue | v | clue | v | clue | v | clue | v | clue | v | clue | v | clue | v | clue | v |
|---|---|---|---|---|---|---|---|---|---|---|---|---|---|---|---|
| 0 | 1 | 32 | 1 | 64 | 1 | 96 | 1 | 128 | 1 | 160 | 1 | 192 | 1 | 224 | 1 |
| 1 | 1 | 33 | 1 | 65 | 1 | 97 | 1 | 129 | 0 | 161 | 1 | 193 | 1 | 225 | 1 |
| 2 | 1 | 34 | 1 | 66 | 1 | 98 | 1 | 130 | 1 | 162 | 1 | 194 | 1 | 226 | 1 |
| 3 | 1 | 35 | 1 | 67 | 1 | 99 | 1 | 131 | 1 | 163 | 1 | 195 | 1 | 227 | 1 |
| 4 | 1 | 36 | 0 | 68 | 1 | 100 | 0 | 132 | 0 | 164 | 0 | 196 | 1 | 228 | 0 |
| 5 | 1 | 37 | 0 | 69 | 1 | 101 | 0 | 133 | 0 | 165 | 0 | 197 | 1 | 229 | 0 |
| 6 | 1 | 38 | 0 | 70 | 1 | 102 | 0 | 134 | 0 | 166 | 0 | 198 | 1 | 230 | 0 |
| 7 | 1 | 39 | 0 | 71 | 1 | 103 | 0 | 135 | 0 | 167 | 0 | 199 | 1 | 231 | 0 |
| 8 | 1 | 40 | 0 | 72 | 0 | 104 | 0 | 136 | 1 | 168 | 0 | 200 | 0 | 232 | 0 |
| 9 | 1 | 41 | 0 | 73 | 0 | 105 | 0 | 137 | 1 | 169 | 0 | 201 | 0 | 233 | 0 |
| 10 | 0 | 42 | 0 | 74 | 0 | 106 | 0 | 138 | 0 | 170 | 0 | 202 | 0 | 234 | 0 |
| 11 | 0 | 43 | 0 | 75 | 0 | 107 | 0 | 139 | 0 | 171 | 0 | 203 | 0 | 235 | 0 |
| 12 | 0 | 44 | 1 | 76 | 0 | 108 | 1 | 140 | 0 | 172 | 1 | 204 | 0 | 236 | 1 |
| 13 | 1 | 45 | 1 | 77 | 0 | 109 | 1 | 141 | 1 | 173 | 1 | 205 | 0 | 237 | 1 |
| 14 | 1 | 46 | 1 | 78 | 0 | 110 | 1 | 142 | 1 | 174 | 1 | 206 | 0 | 238 | 1 |
| 15 | 1 | 47 | 1 | 79 | 0 | 111 | 1 | 143 | 1 | 175 | 1 | 207 | 0 | 239 | 1 |
| 16 | 1 | 48 | 1 | 80 | 1 | 112 | 1 | 144 | 1 | 176 | 1 | 208 | 1 | 240 | 1 |
| 17 | 0 | 49 | 0 | 81 | 0 | 113 | 0 | 145 | 0 | 177 | 0 | 209 | 0 | 241 | 0 |
| 18 | 1 | 50 | 1 | 82 | 1 | 114 | 1 | 146 | 1 | 178 | 1 | 210 | 1 | 242 | 1 |
| 19 | 1 | 51 | 1 | 83 | 1 | 115 | 1 | 147 | 1 | 179 | 1 | 211 | 1 | 243 | 1 |
| 20 | 0 | 52 | 0 | 84 | 0 | 116 | 0 | 148 | 0 | 180 | 0 | 212 | 0 | 244 | 0 |
| 21 | 0 | 53 | 0 | 85 | 0 | 117 | 0 | 149 | 0 | 181 | 0 | 213 | 0 | 245 | 0 |
| 22 | 0 | 54 | 0 | 86 | 0 | 118 | 0 | 150 | 0 | 182 | 0 | 214 | 0 | 246 | 0 |
| 23 | 0 | 55 | 0 | 87 | 0 | 119 | 0 | 151 | 0 | 183 | 0 | 215 | 0 | 247 | 0 |
| 24 | 1 | 56 | 1 | 88 | 1 | 120 | 1 | 152 | 1 | 184 | 1 | 216 | 1 | 248 | 1 |
| 25 | 1 | 57 | 1 | 89 | 1 | 121 | 1 | 153 | 1 | 185 | 1 | 217 | 1 | 249 | 1 |
| 26 | 0 | 58 | 0 | 90 | 0 | 122 | 0 | 154 | 0 | 186 | 0 | 218 | 0 | 250 | 0 |
| 27 | 0 | 59 | 0 | 91 | 0 | 123 | 0 | 155 | 0 | 187 | 0 | 219 | 0 | 251 | 0 |
| 28 | 0 | 60 | 0 | 92 | 0 | 124 | 0 | 156 | 0 | 188 | 0 | 220 | 0 | 252 | 0 |
| 29 | 1 | 61 | 1 | 93 | 1 | 125 | 1 | 157 | 1 | 189 | 1 | 221 | 1 | 253 | 1 |
| 30 | 1 | 62 | 1 | 94 | 1 | 126 | 1 | 158 | 1 | 190 | 1 | 222 | 1 | 254 | 1 |
| 31 | 1 | 63 | 1 | 95 | 1 | 127 | 1 | 159 | 1 | 191 | 1 | 223 | 1 | 255 | 1 |

Table 3

METHOD AND APPARATUS FOR ERASURE DECODING AN ECC CODED BITSTREAM

This application claims the benefit, under 35 U.S.C. §365 of International Application PCT/EP2009/064207, filed Oct. 28, 2009, which was published in accordance with PCT Article 21(2) on May 14, 2010 in English and which claims the benefit of European patent application No. 08305774.5, filed Nov. 5, 2008.

FIELD OF THE INVENTION

The present invention relates to the technical field of error correction coding and decoding of digital data in a burst error environment, in particular to erasure decoding of digital data which comprise low frequency reduction data.

BACKGROUND OF THE INVENTION

In digital data storage, for protection of payload data against errors, error correction encoding is applied before channel coding on the recording side, and correspondingly error correction decoding is performed after channel decoding on the readout side. So-called block codes are one widely used class of error correction codes. Reed-Solomon codes are one example of block codes.

Besides random errors, optical storage channels usually suffer from long bursts of errors induced by scratches, dust, fingerprints, air bubbles and other defects. To combat burst errors, interleaved Reed-Solomon codes are widely used. By the interleaving step, a burst error afflicting a long row of contiguous symbols is transformed into single symbol errors spaced apart widely enough to be correctable by a subsequent Reed-Solomon code.

It is well known that the error correction capability of block codes can be doubled if locations of erroneous symbols are known. Hence an important sub-task of practical error correcting schemes is to estimate or detect these error locations also known as "erasures".

For erasure detection in a burst error environment, a so-called "picket code" scheme has been proposed in U.S. Pat. No. 6,378,100, where user data are regularly interspersed with so-called "burst indicating subcode" or BIS fields. This approach assumes and aims at data sequences containing bursts of errors. Hence, whenever any two consecutive BIS fields are diagnosed as erroneous, the user data between them are assumed to be an erasure. The arrangement of BIS fields and user data is illustrated in FIG. 1. The BIS fields within each sector are grouped together into a so-called BIS codeword, which in turn is provided with a very strong error correction code of its own.

This known scheme of erasure detection may be seen to have the following drawbacks:

Erroneousness of the BIS fields can not be detected individually, it is always complete BIS codewords that have to be read and decoded. Consequently, the erasure detection scheme based on the BIS fields has a latency or delay of one sector.

Inserting the BIS fields plus their error protection causes a considerable redundancy overhead.

Another approach of erasure information generation is disclosed in "A New Error Correction Algorithm for High-Density Optical Storage Systems", JJAP-43-4867. There, rows are divided into blocks. An inner (i+1, i, 2) RS-Code, which is only capable of detecting errors, but not of correcting them, is applied to i evenly distributed information bytes of each block. The resulting RS-Code parity byte is appended to each block. Syndrome checking is used to check the inner RS-codeword integrity. Blocks with inner RS-codeword failure are declared to be erased. The approach abandons wordwise interleaving between different rows. Instead the symbols of each inner RS-codeword are equally distributed along the corresponding block within a row. No error locating RS code is necessary since the physical dilation of inner RS-codewords is small. The absence of interleaving reduces latency. However, the approach of JJAP-43-4867 can be seen to have the drawback that additional redundancy is needed for erasure generation.

An improved erasure detection scheme is therefore desirable.

INVENTION

This invention proposes to use, as the basis of erasure detection, redundancy which is present in a channel encoded data stream. In a method according to the invention, erasure information is derived from redundancy contained in the bitstream. Redundancy generally corresponds to constrainedness of data, e.g. in the sense of dependencies of some data from others. This kind of dependencies, when violated, allows to conclude at the readback side that a data error must be present, from which erasure information can be deducted or estimated, so that erasure detection is enabled.

In the invention, it is recognized that a specific redundancy is present in a channel encoded data stream in case a Data Channel (DC) control method of European Patent Application EP 1990918 A1 is used, and that this specific redundancy can be exploited for erasure detection purposes. The method of EP 1990918 A1 employs so-called DC control bits, which have some, although small, well known redundancy. Hence, taken together with some preceding and subsequent data bits, each DC control bit pattern can be used as an erasure clue. The DC control bits according to EP 1990918 A1 constitute one embodiment of a DC control bit pattern. In a method according to this invention, when an ECC coded bitstream comprises any such DC control bit pattern, erasure information is derived from the DC control bit patterns contained in the ECC coded bitstream.

The redundancy exploited in this invention is based on the fact that not all possible bit combinations or binary word values are valid DC control bits according to EP 1990918 A1. With other words, assuming a number of n control bits being inserted between data blocks, the entire set of $2^n$ distinct word values can conceptually be subdivided into a first subset comprising those word values that do constitute valid DC control bit patterns, and into a second, complementary subset comprising those word values that do not constitute valid DC control bit patterns.

Receiving a binary word whose value does constitute a valid DC control bit pattern can reasonably be interpreted to mean that no channel error occurred, hence these values will also be denoted as "negative clues" in the following.

Correspondingly, receiving a binary word whose value does not constitute a valid DC control bit pattern, can reasonably be interpreted to mean that a channel error occurred, hence the latter values will also be denoted as "positive clues" in the following.

Only a true subset of all distinct word values constitutes valid DC control bit patterns, with other words, the second subset is not empty. This fact shows that the bitstream parts devoted to DC control are constrained; with other words that there is some redundancy contained in these bitstream parts. In the method of DC control according to EP 1990918 A1, more than half of all distinct word values constitute valid DC control bit patterns, which corresponds to the redundancy being small. Only a minority of the distinct word values do not constitute valid DC control bit patterns. Therefore, errors in the storage channel often modify negative clues into other negative clues. With other words: Not all channel errors, even if they affect a DC control bit part of a bitstream, cause a positive clue to appear. The probability of detecting an erasure from receiving a positive clue thus is low and misclassifications must be taken into account. Therefore, this invention describes, as a favorable extension, a "bridging strategy", which can be interpreted as a nonlinear median filter-like postprocessing on the sequence of positive/negative clues viewed as a sequence of bits.

The invention allows to generate erasure information without spending any additional redundancy for error detection. It does so by exploiting inherent redundancy of DC-control bits periodically inserted into the RLL modulated bitstream by a method proposed in EP 1990918 A1. The erasure information generated according to this invention can be used in a system where it constitutes the only kind of erasure information being used. The exemplary embodiment described in the following is such a system.

Alternatively, the erasure information generated according to this invention can be used as a complement to other kinds of erasure information, derived from other sources. Having two kinds of erasure information stemming from different sources, or being generated in different ways, offers the advantage that by consolidating the two kinds of erasure information, e.g. by uniting them with some kind of majority vote, misclassifications can potentially be detected and eliminated. The erasure information generated according to this invention is particularly apt for being used as an additional or complementing erasure information, because its generation does not need any redundancy insertion, with other words there is no rate loss incurred.

BRIEF DESCRIPTION OF DRAWINGS

Exemplary embodiments of the invention are illustrated in the drawings and are explained in more detail in the following description.

In the figures.

Table 1 illustrates the dependency of DC-control bit values on surrounding bit values, when inserted into a (1, 7) RLL code.

Figure 3:
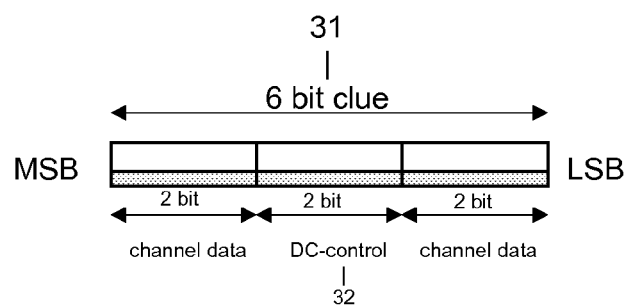

FIG. 3 illustrates the forming of 6 bit erasure clues from 2 bits tail data, 2 DC control bits and 2 bits head data.

Table 2 illustrates which of the 64 distinct values that exist for 6 bit erasure clues constitute valid clues, and which constitute invalid clues.

Figure 4:
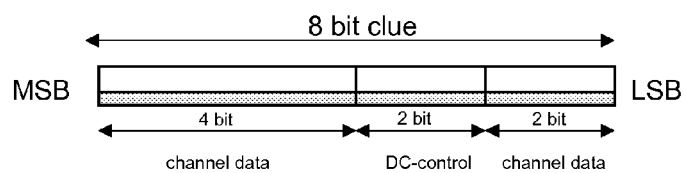

FIG. 4 illustrates the forming of 8 bit erasure clues from 4 bits tail data, 2 DC control bits and 2 bits head data.

Table 3 illustrates which of the 256 distinct values that exist for 8 bit erasure clues constitute valid clues, and which constitute invalid clues.

Figure 5:
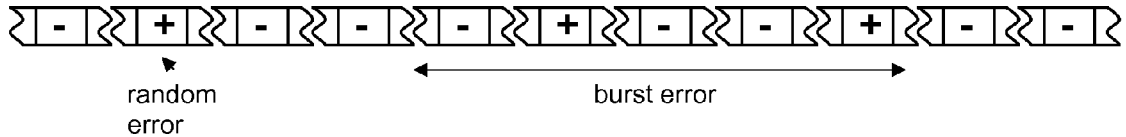

FIG. 5 illustrates an example sequence of received clues and the assumed underlying error events.

Figure 6:
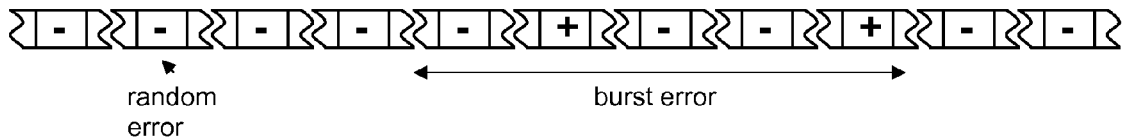

FIG. 6 illustrates the clue sequence of FIG. 5 after ignoring isolated positive clues (Step 1).

Figure 7:
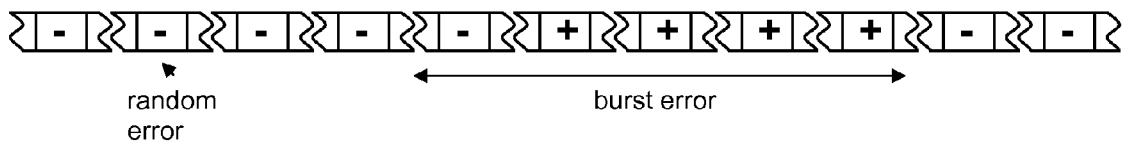

FIG. 7 illustrates the clue sequence of FIG. 6 after connecting non-isolated positive clues (Step 2).

Figure 8:
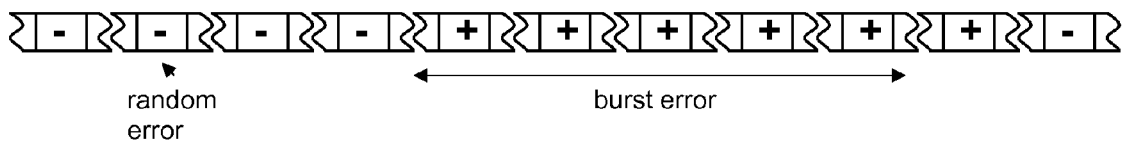

FIG. 8 illustrates the clue sequence of FIG. 7 after expanding sequences of positive clues (Step 3).

Figure 9:
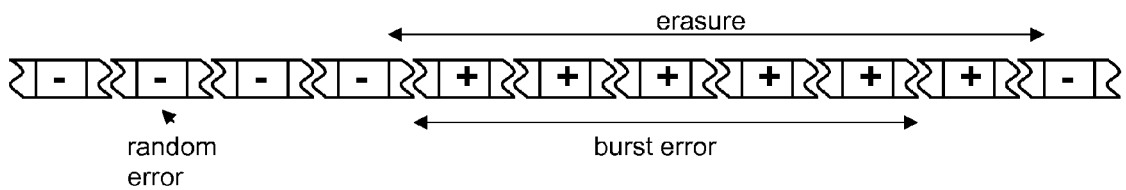

FIG. 9 illustrates the range of data that are being flagged as erasures (Step 4).

In digital data storage, channel coding, also denoted as channel modulation, is used to transform the digital data into a signal that is appropriate for the requirements of the storage channel. One concept used in channel coding is denoted as "DC control" and comprises signal processing steps that influence the low frequency end of the spectrum of the signal. Signal regeneration on the storage readout side is facilitated if the signal being written onto a storage medium is "DC free", with other words, if, at least on average, this signal contains as much of "pit" as of "space" in case of optical data storage, or as much of "plus" as of "minus" in the magnetic data storage case. The low frequency content of a signal is measured in that context by a so-called running digital sum, RDS.

European Patent Application EP 1990918 A1 describes methods and apparatuses for controlling the DC-content while channel encoding a sequence of digital data blocks. The data blocks are individually subdivided into a head part, a body part, and a tail part, each of varying length. Each tail part of a specific one of the data blocks, together with some inserted control bits and the head part of the subsequent one of the data blocks are grouped into a so-called control block. According to EP 1990918 A1, the sizes of the head and tail parts are dynamically chosen in such a way as to enable independent runlength limited encoding of the data block's body parts and of the control blocks. Control bit insertion according to EP 1990918 A1 comprises a choice between a so-called "inverting" control bit pattern and a "preserving" control bit pattern, by which choice the RDS contribution of the body part can be inverted. EP 1990918 A1 describes to exercise the choice in such a way as to minimize the DC content.

It is well known that the error correction capability of RS codes can be virtually doubled if locations of erroneous symbols are known. Hence an important sub-task of practical error correcting schemes is to estimate these error locations also known as "erasures". In the known Blu-Ray Disc format, a picket code scheme based on U.S. Pat. No. 6,378,100 is used for this, where user data are regularly interspersed with so-called "burst indicating subcodes" or BIS, and where the user data between any two consecutive erroneous BIS fields are assumed an erasure.

Blu-ray disc uses a picket code scheme that locates erroneous symbols within the pickets. This information can be exploited in a certain way to declare erasure between erroneous pickets. The pickets are therefore also referred to as burst indicating subcode or BIS. In the Blu-Ray format, each ECC frame consists of 4 pickets where the first picket is given by the sync words.

In order to exploit the full erasure correcting capability of the RS [248, 216, 33] code that protects the user data, 24 interleaved RS [62, 30, 33] code words are used to locate errors within the pickets with high probability.

Basic ideas of this scheme stem from U.S. Pat. No. 6,378, 100. They are also published in "Optical Disc System for Digital Video Recording", JJAP-39-912. U.S. Pat. No. 6,378, 100 refers to picket code words as "clue words", which "are formed by encoding the data into code words of a first multi-symbol error correcting code". User data RS code words are named "target words", which "are formed by encoding into code words of a second multi-symbol error correcting code". Together they are referred to as "multiword information" split "into clue words and target words" and "with wordwise interleaving and error protection coding".

This picket code scheme can be seen to have the following disadvantages:

Erasure information can not be generated unless a certain number of rows or sync blocks, representing a single sector, have been received and decoded. This results in a minimum latency of one sector.

Additional redundancy is needed for high level error protection of the clue words.

According to the invention, erasure information within a stream of read out channel data bits is generated by checking the integrity of periodically inserted error locating clues between blocks of channel data bits. Blocks between error indicating (positive) clues within a certain distance are then declared to be erased.

A clue consists of a number of channel data bits or other subchannel data bits provided with additional redundancy. Redundancy can be induced by parity checks, CRC, or any other error detection code or method. Also inherent redundancy, not primarily intended for error detection, induced by any other method, like DC-control bit insertion, might be used for integrity checks.

The important point to note is that according to this invention, integrity testing, amounting to error detection, can be performed on each individual clue disregarding other clues, i.e. no multiple-symbol clue words do exist. This property will be denoted as "self checkable clues" in the following.

Since clues are self checkable and the induced redundancy is usually low, the probability of error detection is also low. But a long burst of channel failure, i.e. a long burst error, will likely corrupt many clues. Therefore the probability of detecting at least some of them will rise when the length of the burst increases. Negative clues situated between two close together positive clues—where the limit distance for considering two clues as "close together" depends on the error detection probability and the random error probability—are assumed to be caused by undetected errors. Based on this assumption, the negative clues between close together positive clues are inverted, so that a continuous sequence of positive clues representing a long erasure is generated. The longer the burst the more reliable the erasure information will be.

In the embodiment, a stream of channel data bits is assumed to be separated into blocks through periodically inserted sync patterns. It is further assumed that corruption of the sync patterns by error bursts will likely be detected. The preceding assumptions will allow erasure intervals to be declared within each sync block independently, but the principles of the invention will also be applicable if any of the assumptions does not hold.

Figure 1:
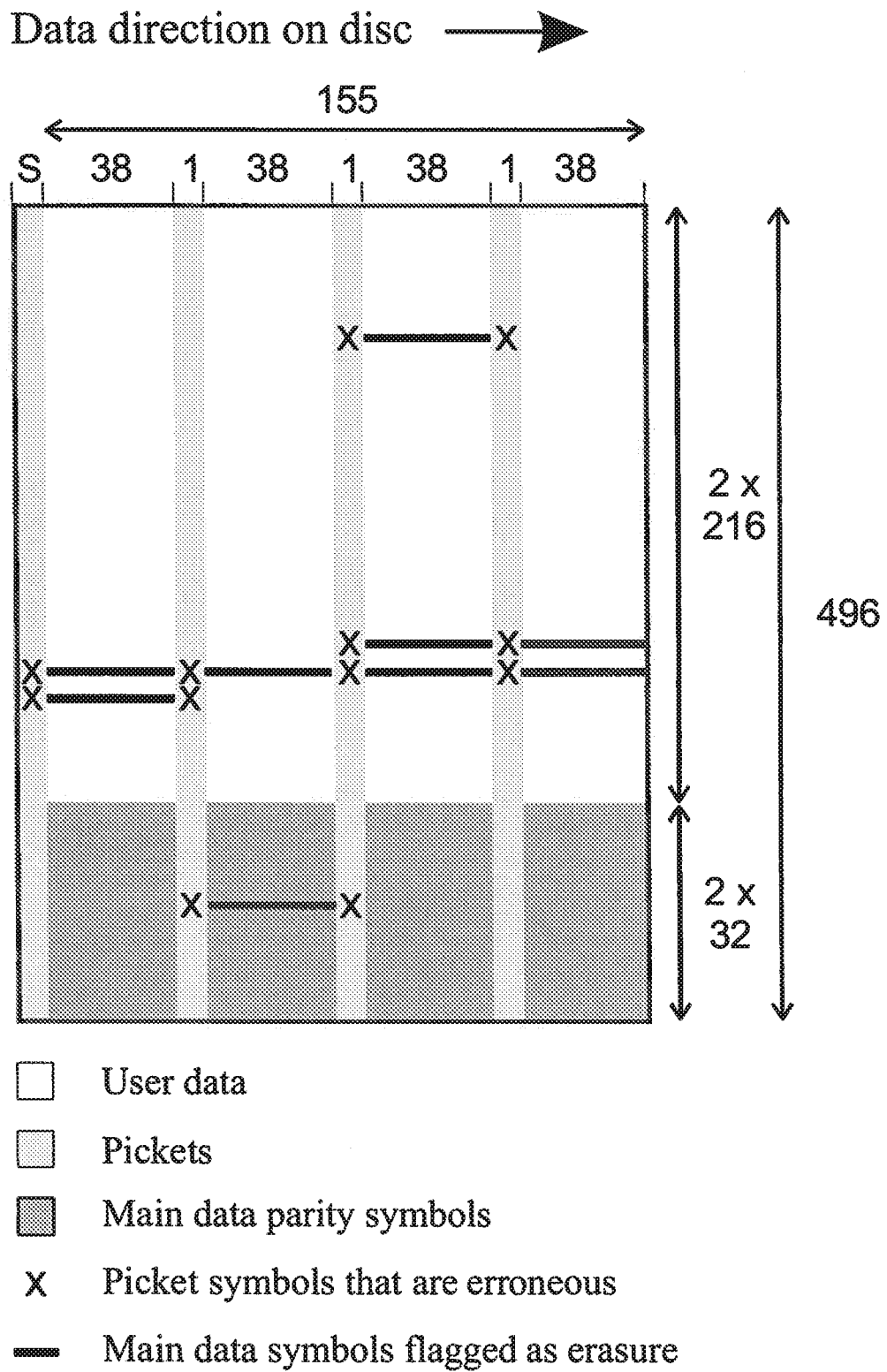
FIG. 1 illustrates the prior art BD picket code. It is quoted from "1.B Physical Format specification for BD-R", a technical white paper published at www.blu-raydisc.com
Figure 2:
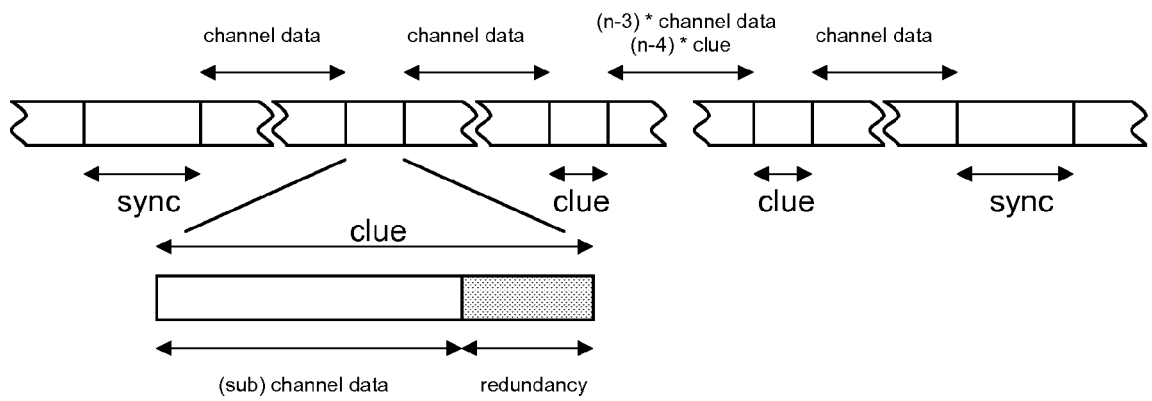
FIG. 2 illustrates the subdivision, according to the invention, of sync blocks into a sequence of channel data blocks with intermittent erasure clues.

As shown in FIG. 2, in the embodiment, a sync block is separated into n channel data blocks through (n−1) erasure clues or clues. Usually the number of channel data bits per block will be much greater than the number of clue bits. This is symbolically illustrated in FIG. 2 by the broken lines. With other words: the number of clue bits is considerably smaller than the number of channel data bits between any two consecutive clues.

The invention aims at identifying bursts of errors through checking the integrity of the clues. Positive clues indicating integrity check failure are used to declare intervals of erasure. It is required that the clues can be self checkable, i.e. no other information than the clue itself is needed to tell if the clue has been corrupted or not. This is in contrast to the method described in U.S. Pat. No. 6,378,100, where clues are extracted from a multi-symbol codeword. U.S. Pat. No. 6,378,100 derives error locative clues from the encoded clue words, hence some error locating process has to be involved. In the present invention, no error locating process is needed since clue locations are known.

Self checking clues of a length y holding extra error detection redundancy can be constructed by using y predefined data bits encoding y-z (sub)channel data bits with any (y, y-z) error detection code, for example singe parity check, CRC, etc. In case of systematic codes, parities shall be prefixed or suffixed.

This invention uses a different approach, in that self checking clues are constructed without the use of extra redundancy, instead using inherent redundancy of periodically inserted subchannel or control structures as a clue. According to one aspect of this invention, the redundancy induced by the method of DC-control bit insertion as given in EP 1990918 A1 is exploited as self checking clue. Table 1 illustrates the DC-control bit insertion into a (1, 7) RLL code according to EP 1990918 A1. The need to spend 2 DC-control bits to guarantee inversion or preservation of the differential RDS of the DC-control block arose from only a few special combinations of data bits. Hence, every two DC control bits chosen according to EP 1990918 A1 contain a redundancy of slightly less than one bit.

The two DC-control bits, shown in Table 1 as $c_i$, at least in some cases depend on the two tail bits $u_{i-1}^{tail}$ preceding them and on the subsequent two head bits $u_i^{head}$. Those lines of Table 1, where either a value for $u_{i-1}^{tail}$, or a value for $u_i^{head}$, or both, are not shown, constitute a shorthand notation and are to be interpreted assuming that the empty table cells designate "don't care".

In order to be able to evaluate the described dependency, the two tail bits, the two DC-control bits and the two head bits are concatenated in this order to yield a 6 bit clue. Using the specific dependency of the DC control bits as prescribed by EP 1990918 A1 and as illustrated in Table 1, and individually listing the cases summarized in the "don't care" cells thereof, it turns out that among the 64 distinct values that exist for 6 bit words, 37 are negative clues indicating validity, and 27 are positive clues indicating invalidity. This means that the probability of finding any error is low. With other words, the redundancy is spread across the clue.

Table 2 illustrates which of the 64 distinct values that exist for 6 bit erasure clues constitute valid clues, and which constitute invalid clues.

The advantage of using DC control bits as erasure clues is, that it does not require any insertion of additional redundancy, hence this method does not suffer from any rate loss. Also, every clue can be checked instantly after reception simply by looking its value up in Table 2, or any equivalent operation.

Also, it must be taken into account that DC-control bits, and hence clues, will appear frequently within the channel data stream, which partly compensates for their weak error detection capabilities.

The error detection probability can be further increased if, instead of two preceding data bits, four preceding data bits are taken into account. FIG. 4 illustrates this variant of erasure clue construction. Among the 256 distinct 8 bit clue values, 133 constitute negative clues, and 123 constitute positive clues. Table 3 shows the resulting lookup table, i.e. it illustrates which of the 256 distinct values that exist for 8 bit erasure clues constitute valid clues, and which constitute invalid clues. Valid, i.e. negative clues are indicated by "1", invalid i.e. positive clues by "0".

Whenever the clue error detection capability, either coming from extra or inherent redundancy, is low, a bridging strategy can be applied to identify intervals of erasure that are due to a large number of undetected clues.

The following bridging strategy makes use of positive clues to identify intervals of erasure. Sync patterns might serve as boundary clues with high burst error detection potential and high reliability. This will allow declaring erasure within a sync block without regarding clues in adjacent sync blocks. Otherwise a sliding window approach has to be followed.

In both cases the following strategy might be applied step by step:

Step 1: Ignore single, i.e. isolated positive clues. In this, a positive clue is to be considered as isolated, if its distance to the closest other positive clue exceeds a certain threshold. These isolated positive clues will likely result from random errors and thus are toggled to negative. In random error environments, it may be appropriate to apply a smaller threshold distance than in virtually error-free environments.

Step 2: Connect non-isolated positive clues. Sequences of consecutive negative clues between two positives clues that are not further away from each other than the threshold distance, are assumed to be due to an undetected burst error and hence are toggled to positive.

Step 3: Expand sequences of positive clues by a margin: A certain number of negative clues adjoining sequences of consecutive positive clues are toggled to positive. The size of this margin will be governed by the desired ratio between misdetected and undetected clues.

Step 4: Flag as erasures positive clues and any channel data blocks that are flanked on at least one side by positive clues.

FIGS. 5 to 9 illustrate an example of how the bridging strategy is applied. In the example, a single random error and a burst error are assumed as denoted. It is assumed that, because of these errors, three positive—i.e. error indicating—clues have been identified in a channel bit stream, shown as "+" in FIG. 5, in the 2nd, 6th, and 9th clue from left. The threshold distance of the above step 1 is assumed to be 3 channel data blocks, including 2 clues in-between. The margin of above step 3 is assumed to be 1 channel data block.

Step 1: Ignore isolated positive clues: The positive clue denoted as "random error" in FIG. 5 will be declared to be negative since the next positive clue is 4 channel blocks away, which distance exceeds the threshold distance of 3. The two positive clues denoted as "burst error" in FIG. 5 will remain unchanged, because their distance is within the threshold distance. FIG. 6 shows the result of applying step 1: The isolated clue assumed to stem from a random error has been deleted.

Step 2: Connect non-isolated positive clues: The two negative clues in the interval between the two remaining positive clues are toggled to positive. FIG. 7 shows the result of applying step 2: There now is a single consecutive "run" of positive clues from and including the 6th clue to and including the 9th clue.

Step 3: Expand sequences of positive clues by a margin: Applying a margin size of one, one adjoining clue to the left and right of the positive run is toggled to positive. FIG. 8 shows the result of applying step 3: The run of positive clues now extends from and including the 5th clue to and including the 10th clue.

Step 4: As denoted in FIG. 9, 7 data blocks including the intermittent 6 positive clues are declared to be erased. Note that the rightmost positive clue, i.e. the 10th clue that was toggled to positive in the course of the margin 1 extension, actually constitutes a misdetection or false positive. No clues were undetected, i.e no false negatives.

The general idea of the invention might be applied to any transmission or storage system, where errors are likely to occur in long bursts, and/or where the receiver or readpath can take advantage of low latency erasure information.

ADVANTAGES OF THE INVENTION

The proposed clues from DC control bits are self-checkable, i.e. no other information is needed for detecting whether a clue was corrupted;

Hence there is no inherent latency;

The DC control bits and hence the clues based thereon are interspersed into the user data stream more often than the BIS of U.S. Pat. No. 6,378,100 which partly compensates for their weaker error detection capability;

The invented method provides erasure detection without any redundancy overhead beyond what is anyway needed for DC control.

The invention allows to advantageously generate low latency erasure information before error correction decoding within a burst error environment. Low latency erasure information can be useful for the following reasons or purposes:

If an outer burst error correcting code like Reed-Solomon is used in conjunction with a row aligned, random error correcting inner RS or LDPC code etc. of length smaller than a sector, it is advantageous to have erasure information available prior to inner code decoding since long burst errors will likely exceed the error correcting capabilities of the inner code, making decoding useless. On the other hand, short error bursts might still be decodable by the inner code if correctly flagged as erasure.

If interpolative timing recovery working on sync blocks is used, a coarse integrity check can be performed by evaluating erasure information.

If any other task within an optical drive readpath is able to take advantage of low latency erasure information.

The invention presents a strategy for generating erasure intervals from error indicating clues. Error bursts of any length can be detected.

With other words: The error correction capability of block codes can be doubled if error locations are known. Prior art approaches for error location detection always involve adding dedicated redundant data which then are evaluated to yield error location information. The present invention proposes and describes how given DC control bits 32 that are anyway present in a data stream are used and error location information in the form of clues 31 is derived therefrom.

The invention claimed is:

1. A method for erasure decoding an ECC coded bitstream that comprises Data Channel (DC) control bit patterns formed from DC control bits of the ECC coded bitstream together with preceding and subsequent data bits from the ECC coded bitstream, comprising:
   using the DC control bit patterns as self-checkable erasure clues,
   wherein no other information is needed other than the erasure clue itself to derive if the erasure clue has been corrupted or not,
   wherein the erasure clues constitute an erasure information where negative erasure clues indicate no error, and positive erasure clues indicate the occurrence of an error.

2. The method according to claim 1, wherein the erasure information from the bitstream is postprocessed by the following steps:
   ignoring isolated positive clues,
   connecting non-isolated positive clues,
   expanding sequences of positive clues, flagging as erasures the expanded sequences of positive clues and any channel data blocks that are flanked on at least one side by positive clues.

3. The method according to claim 1, wherein the erasure information is consolidated with a second erasure information before being used in the erasure decoding.

4. The method according to claim 3, wherein the consolidating is performed by majority decision among corresponding bits of the erasure information and of the second erasure information.

* * * * *